United States Patent [19]

Rigg et al.

[11] Patent Number: 5,802,349

[45] Date of Patent: Sep. 1, 1998

[54] METHOD FOR GENERATING AN OPTIMIZED INTEGRATED CIRCUIT CELL LIBRARY

[75] Inventors: Dana M. Rigg, Chandler; Sleiman Chamoun, Phoenix; James H. Tolar, II, Mesa; Mark Chase, Peoria; Supamas Sirichotiyakul, Tempe, all of Ariz.

[73] Assignee: Motorola, Inc., Schaumburg, Ill.

[21] Appl. No.: 589,240

[22] Filed: Jan. 22, 1996

[51] Int. Cl.$^6$ .............................. G06F 9/455; G06F 17/50
[52] U.S. Cl. .................................................... 395/500
[58] Field of Search .............................. 364/488–491, 364/578; 395/500

[56] References Cited

U.S. PATENT DOCUMENTS

| | | | |
|---|---|---|---|
| 5,349,536 | 9/1994 | Ashtaputre et al. | 364/491 |
| 5,495,419 | 2/1996 | Rostoker | 364/468 |
| 5,566,078 | 10/1996 | Ding et al. | 364/490 |
| 5,619,419 | 4/1997 | D'Haeseleer et al. | 364/490 |

OTHER PUBLICATIONS

S. Kirkpatrick, C.D. Gelatt, Jr., and M.P. Vecchi, "Optimization by Simulated Annealing", *Science*, 220, May 13, 1983 pp. 671–680.

*Primary Examiner*—Kevin J. Teska
*Assistant Examiner*—Ayni Mohamed
*Attorney, Agent, or Firm*—Gary W. Hoshizaki; Sharon K. Coleman

[57] ABSTRACT

A cell library (21) is optimized for specific operating characteristics. A stimulus file (23) is divided into a number of simulation run files. The simulation run files (27) are distributed to more than one computer work station so that the simulation of the cell occurs in parallel. The netlist (24) of each cell is parameterized to allow the cell to be changed and resimulated to better meet the specific operating characteristics. A cost function (32) is provided which uses the results of a transistor level simulation to calculate the quality of the cell design relative to the specific operating characteristics. Simulated annealing (34) is used to generate new simulation parameter values from a cost generated from the cost function (32). The cell is resimulated a number of times to optimize for the specific operating characteristics and the best design is retained for a new cell library (39). The process is repeated for each cell of the cell library (21).

10 Claims, 2 Drawing Sheets

METHOD FOR GENERATING AN OPTIMIZED INTEGRATED CIRCUIT CELL LIBRARY

BACKGROUND OF THE INVENTION

This invention relates, in general, to integrated circuit cell libraries, and more particularly, to the optimization of an integrated circuit cell library to enhance specific performance characteristics.

In the past, integrated circuit designs were individually built for each application. The small number of devices used in a circuit and the expected long cycle time to produce a chip were common place in the era of full custom circuit designs. The trend of producing full custom circuit designs was made less desirable due to cycle time reductions required by semiconductors users for the introduction of new products.

As the scale of device integration increased it became unmanageable to design and layout circuits by hand. Moreover, it became impractical to redesign the same circuit blocks over and over again. Bringing new products to the market place in a timely fashion is also a critical factor. Automation of circuit design and layout is made possible with the computational power of computer work stations made available to the engineer. One concept, in particular, that made large system designs feasible was the advent of a cell library to build different circuits. A cell library contains many different circuit blocks commonly used in the design of an integrated circuit. A designer may build a schematic diagram or use a logic synthesis tool that maps a high level description into the target cell library.

A cell library is designed to meet the needs of the average user. In essence, the design of a cell library is a compromise in performance, power, and area. Generating new cell libraries to provide specific performance characteristics, for example, low power or high speed takes a significant amount of human resource and time. In most cases, the development of additional cell libraries is not cost efficient and thus is not undertaken.

It would be of great benefit if a method could be provided that allowed a new cell library to be generated from an existing cell library, the new cell library being designed to meet specific performance criteria set up by the user based on unique design requirements.

DETAILED DESCRIPTION OF THE DRAWINGS

Figure 1:
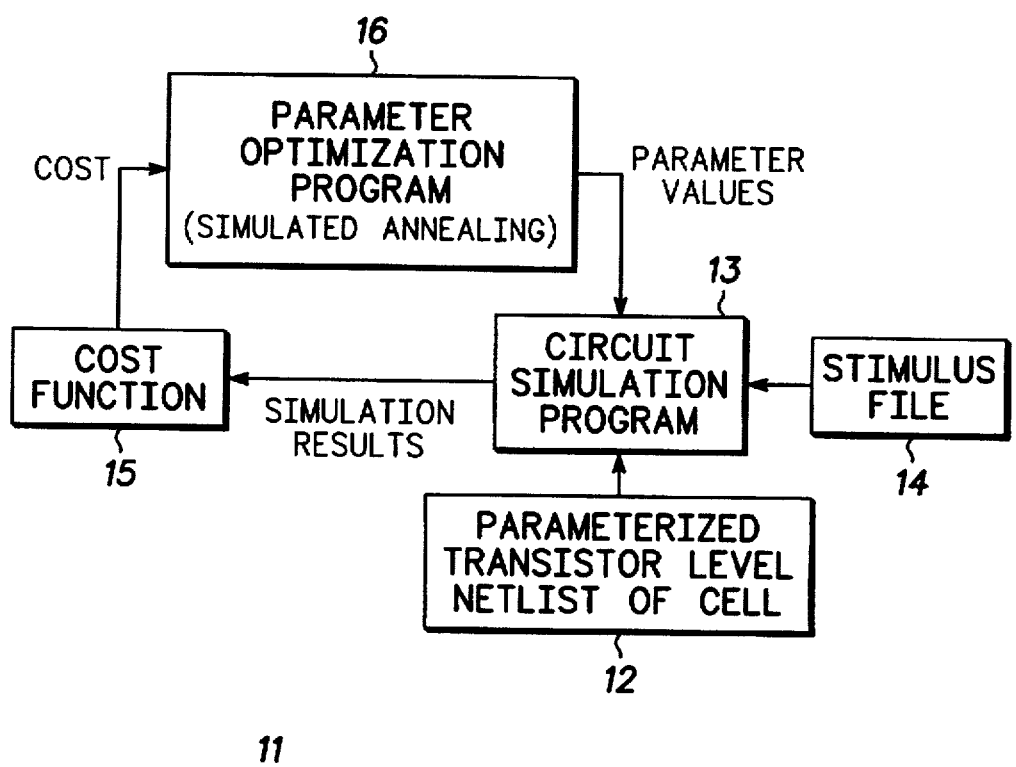
FIG. 1 is a block diagram of an optimization process for a cell of a semiconductor cell library in accordance with the present invention.

In general, a cell library is a library of circuit blocks used to construct an integrated circuit design. Library cells range from simple logic elements such as inverters, NAND gates, and NOR gates to complex cells such as memories, multipliers, or microprocessors. The use of a cell library greatly reduces design cycle time and increases the reliability of an integrated circuit. In general, the cells have been designed, simulated, modeled, and drawn by a team of engineers and technicians. A user simply generates an interconnected netlist of cells to produce an integrated circuit design. Simulation is based on delay models of each cell thereby greatly reducing simulation time. Typically, layout of the integrated circuit design is automated using a routing tool which places and interconnects the cells together based on the netlist of the integrated circuit design.

The design of a cell library is an extremely labor intensive task. Each cell is designed, simulated at a transistor level, and modeled by an engineer or technician. Development time of a cell library can take months or years depending on the complexity and number of cells in the library. The cell designs are also a compromise in performance, power, and size. In other words, a cell library is designed to meet the needs of a majority of it's users but not optimized for one specific characteristic. Typically, additional libraries are not developed for specific operating characteristics due to the time and cost involved with the development.

Another factor in the development of a cell library is the time required to perform transistor level simulations of each cell. Transistor level simulations are usually performed on a computer work station having a public domain circuit simulation program such as SPICE or an equivalent program. Transistor level simulations take a substantial amount of time. For example, the transistor level simulation of a flip flop can take several hours whereas the simulation of a high speed multiplier circuit may take days. Thus, the process of refining a design of a cell can take a significant amount of time due to the simulation time alone. Transistor level simulations of each cell are important to generate accurate delays for all input stimulus and different operating conditions (for example, process, temperature, or voltage variations).

The cost of developing a wafer process is staggering as is well known by one skilled in the art. Yet, semiconductor manufacturers continue to develop new generations of wafer processes that produce smaller and denser devices with more layers of interconnect to increase the amount of circuitry that is placed on an integrated circuit. Semiconductor manufacturers realize that an increase in performance, circuit density, or reduction in power is essential to maintaining and increasing semiconductor product marketshare. The time frame between releases of new wafer processes has been short enough to make the development of additional libraries optimized for specific operating characteristics impractical. This is inherently inefficient because the integrated circuit designer is left with a cell library that is a design compromise and the wafer process is never fully utilized for it's performance potential.

Building multiple semiconductor cell libraries that are optimized for specific performance characteristics provides significant advantages to a semiconductor manufacturer. First, the customer has access to customized cells optimized for specific performance characteristics such as speed, low power, or density (reduced die size). Similarly, the semiconductor manufacturer can market cell performance which exceeds the competition. Second, the life of a wafer process is extended by increasing performance that is offered when compared to a next generation semiconductor process. Third, the design cycle time between wafer processes could be extended due to the performance increase. Finally, a low cost alternative to advanced wafer processes could be provided to the customer which extends the life cycle of a wafer process.

The development of optimized semiconductor cell libraries for specific operating characteristics is possible using automated techniques. FIG. 1 is a block diagram of an optimization process 11 for a cell of a semiconductor cell library. Multiple transistor level simulations of a cell are run to optimize performance characteristics. Feedback from transistor level simulation results is used to generate new parameter values which better meet the specific operating characteristics.

A parameterized transistor level netlist 12 of a cell is generated and provided for simulation. The parameters or variables allow the characteristics of the cell to be modified. For example, the gate length or gate width of a transistor is a common parameter that is varied in an optimization process. Transistor level simulation is performed using a simulation program such as SPICE. SPICE is a public domain simulation software well known by one skilled in the art. Parameters used in the optimization process are determined by reviewing the transistor or element model and parameterizing portions of the model that affect the specific performance characteristics of the cell being optimized. An initial set of parameter values is provided to a circuit simulation program 13 for starting simulation on a cell.

A stimulus file 14 is provided to circuit simulation program 13. Stimulus file 14 provides input signals and expected output signals for simulating the cell. The expected output signals are used to verify correct operation of the cell. Circuit simulation program 13 runs a simulation of the cell for the parameter values provided and outputs simulation results corresponding to the operation of the circuit. The simulation results are provided to a cost function 15 that generates a cost corresponding to the quality of the simulation results meeting the specific operating characteristics to which the cell or cell library is being designed. The cost is provided to a parameter optimization program 16 which generates new parameter values using statistical mechanics with combinatorial optimization. In theory, the new parameter values will produce simulation results that improve the specific performance characteristics. In the embodiment of FIG. 1, parameter optimization is accomplished using simulated annealing. Simulated annealing has been found to produce excellent results in the optimization of cells of an integrated circuit cell library. Simulated annealing is disclosed in an article by S. Kirkpatrick, C. D. Gelatt, and M. P. Vecchi, titled "Optimization by Simulated Annealing, in SCIENCE, May 13, 1983, Volume 220, Number 4598, pages 671–680 which is hereby incorporated by reference.

The process of simulating, generating a cost, generating new parameter values, and resimulating using the new parameter values is stopped after a fixed number of parameter value sets have been examined or the improvement in cost has not achieved a minimum threshold. A parameter value set is a group of values assigned to parameters of a parameterized netlist being simulated. A minimum threshold for the cost is set to stop the iterative simulation process if a specified improvement is not achieved. As mentioned previously, running many transistor level simulations on a computer work station can take a substantial amount of time. It is impractical to simulate a cell library having tens or hundreds of cells on a single work station due to the time required for the simulations. The simulation time alone could run any years for a cell library of moderate size and complexity.

It is common in a semiconductor engineering environment to have more than one computer work station in a work area. Typically, each engineer or technician is assigned a computer work station for his or her job function. Generally, the computer work stations are tied in a network ring so that information can be passed between the computer work stations. Furthermore, the computer work stations are not used 24 hours a day. At night or in the early morning hours most computer work stations are idle. An approach to simultaneously simulate on more than one computer work station is used to reduce the time period in optimizing an entire cell library.

Figure 2:
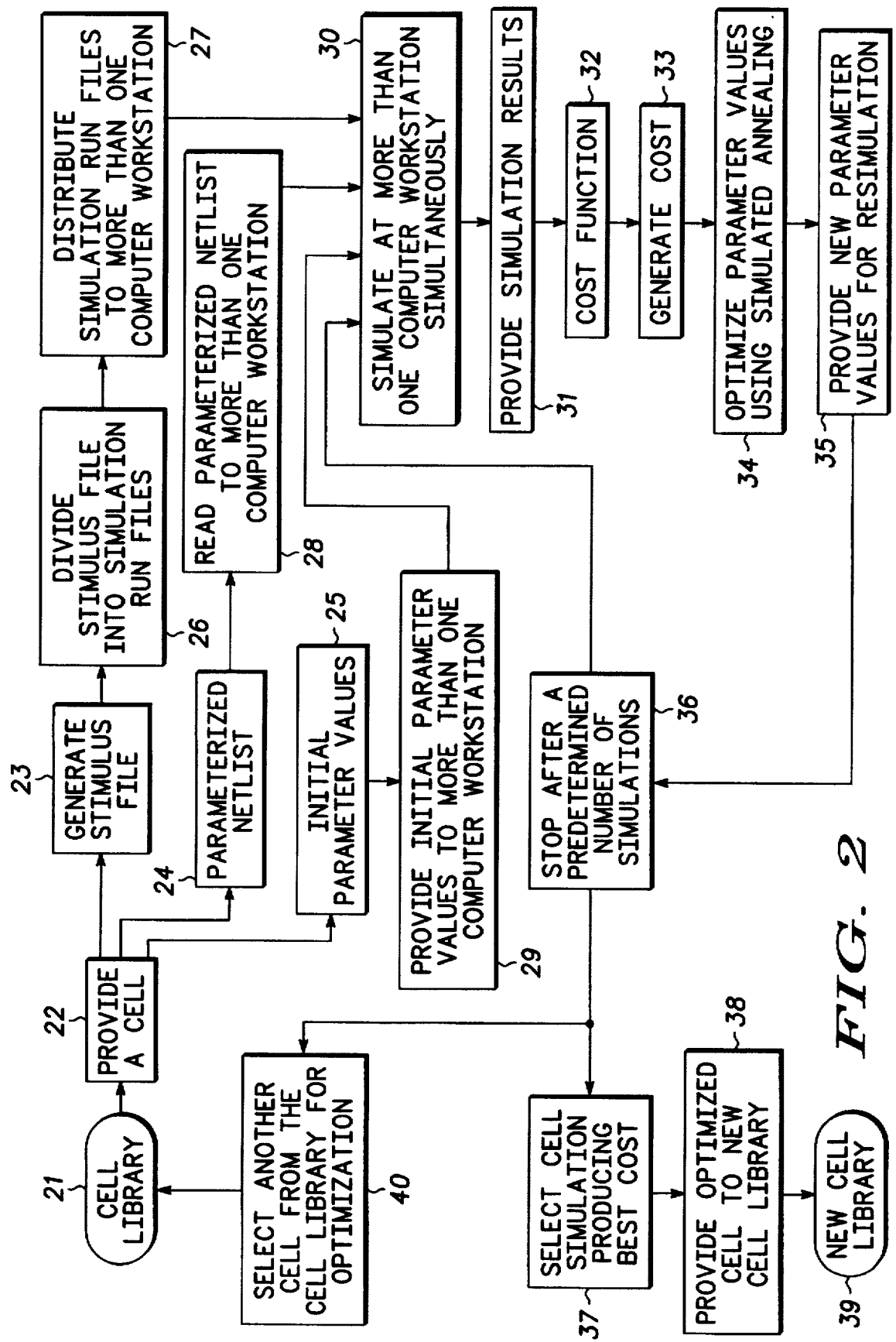
FIG. 2 is a flow diagram of a cell library optimization process in accordance with the present invention.

FIG. 2 is a flow diagram of a cell library optimization process. A cell library 21 includes a number of different cells or circuits that are used to form a larger more complex circuit design. The process of cell optimization uses a transistor level simulator. Transistor level simulation is extremely time consuming even for small circuits. The amount of time for a circuit simulation is a function of the circuit size and the number of components. For example, a single simulation can take hours, days, or weeks. In general, transistor level simulation time increases significantly with circuit size.

The optimization process of a cell is an iterative process, multiple simulations are needed to optimize the cell for specific operating characteristics. This problem is compounded by the fact that a cell library has tens or hundreds of cells each requiring multiple simulations for optimization. An efficient method for optimizing a cell library reduces the time period for performing transistor level simulations such that producing more than one cell library each optimized for specific operating characteristics is feasible within the life cycle of an integrated circuit wafer process. Transistor level simulation time is significantly reduced by using more than one computer work station to simultaneously simulate and optimize a cell of the cell library.

A first step in the cell optimization process is to provide a cell 22 from the original cell library 21. A stimulus file is generated (generate stimulus file 23) for exercising the cell during optimization. The stimulus file contains power and timing delay vectors that are applied to the inputs of the cell. The stimulus file is then divided into simulation run files (divide stimulus file into simulation run files 26). The simulation run files are simulatable portions of the stimulus file. The simulation run files are distributed to the more than one computer work station (distribute simulation run files to more than one computer work station 27) which allows the cell to be simulated in parallel which decreases simulation time. It should be noted that each computer work station has the ability to run a transistor level simulation independently from the other computer work stations.

The optimization process uses a parameterized netlist of the cell (parameterized netlist 24) for simulation. Varying the parameters values with each simulation of the cell allows the cell to be modified and analyzed to optimize the specific operating characteristics. A netlist is a transistor level description of the cell comprising the elements which form the circuit and the interconnection of the elements. Typically, a netlist of the cell is generated from a cell layout, synthesized via a logic synthesis tool, or created by a circuit designer. The parameterization of he netlist determines which circuit features will be adjusted to affect the performance of the cell. Parameters are found by review of the device models of the transistor level simulation program. The computer work stations read the parameterized netlist to perform transistor level simulations of the cell (read parameterized netlist to more than one computer work station 28).

A set of initial parameter values is provided for the simulation of the cell (initial parameter values 25). The set of initial parameter values is provided to each computer work station. Each computer work station simultaneously simulates the cell using the initial parameter values and the provided simulation run file. Further reductions in simulation time is achieved by removing non-essential circuitry in the simulation. For example, only the worst case paths of a cell are simulated in a speed optimization. Moreover, the worst case paths are broken into circuit segments which are simulated in pieces by each computer work station. Reducing the amount of circuitry simulated greatly decreases simulation time. The sum of the simulated segments corresponds to the overall delay of the path. Another example is the optimization of the power consumption of a cell. The size of a simulation is reduced by dividing the cell into simulatable sections which are simulated in parallel by the computer work stations. The sum of the power consumed by each section of the cell corresponds to the overall power dissipated. In either of the examples stated above the result is a reduction of simulation time.

The results of the simulation of the cell are provided to a cost function (provide simulation results 31 and cost function 32). The cost function evaluates how well the parameter values improve the specific operating characteristics defined in the cost function. The cost function is alterable to investigate various performance, power, and area trade-offs. Some examples common to circuit optimization include evaluation of power-delay products, defining delay and edge-rate ratios, performing simple sum-of weights calculations, and specifying numerical constraints on characteristics. The cost function is used to both optimize the cell and allow a calculation of the resultant cost.

The convergence to a set of new parameter values is driven by an algorithm known as Adaptive Simulated Annealing hereinafter referred to as simulated annealing (optimize parameter values using simulated annealing 34). Simulated annealing is a general purpose optimization algorithm designed to converge to a best-cost solution without requiring exhaustive exploration of the design space. The use of simulated annealing dramatically reduces the time to achieve an optimal cell design by minimizing the number of transistor level simulations required to meet the specific operating requirements. The new parameter values are provided to the computer work stations for resimulating the cell (provide new parameter values for resimulation 35).

As mentioned previously, the optimization process is an iterative process. Running multiple simulations with new parameter values allows simulated annealing to produce the cell parameter values which best optimizes the specific operating characteristics. At some point, the generation of a cost, the generation of new parameter values, and resimulation of the cell is stopped (stop after a predetermined number of simulations 36). For example, the optimization process is stopped after a fixed number of parameter sets are examined or when an improvement in cost fails to meet a minimum threshold.

The parameter values corresponding to the simulation producing the best cost are selected after the optimization process is stopped (select cell simulation producing best cost 37). The parameter values are used to build a new cell optimized for the specific operating characteristics (provide optimized cell to new cell library 38). The new cell is entered in a new cell library (new cell library 39). The optimization process is then repeated for each cell of the cell library until the new cell library is created (select another cell from the cell library for optimization 40). The new cell library is then used to generate circuits that provide increased performance in the areas of optimization.

An example which illustrates the benefits of generating additional cell libraries optimized for specific operating characteristics is in the design of a complex circuit. A micro-controller circuit is a complex design that is built from a cell library. Performance parameters such as low power are a critical factor for circuit designs powered by a battery. The microcontroller circuit in this example is formed from approximately 1800 cells. The cells of the cell library were designed for a 0.8 micron channel length Complementary Metal Oxide Semiconductor (CMOS) process. The micro-controller built from the existing cell library was simulated having a static power of 0.251 microwatts, a dynamic power of 6.91 milliwatts, and a peak total power of 8.69 milliwatts.

The optimization process for the cell library was performed on 20 computer work stations over a twelve day period in a typical engineering environment. The cell library comprised 188 combinational cells, 26 sequential cells, and 20 tri-state cells. In this example, only the combinational cells of the library were optimized but this technique can be applied to other types of cells as well (for example sequential or tri-state cells). The specific operating characteristic being optimized was power delay product. A single cost function was applied to the entire library of optimized cells. Individual cost functions can be applied on a cell by cell basis as well. The cost function, a delay-power product, contained a punishment factor that was applied when cell output rise/fall edge rate ratios fell outside of a specified range. The optimized cells when used to form the micro-controller produced a significant reduction in power. The static power for the optimized micro-controller was 0.246 microwatts which yielded a 1.99 percent reduction in static power. The dynamic power for the optimized micro-controller was 5.84 milliwatts which yielded a 15.48 percent reduction of power. The peak total power for the optimized micro-controller was 7.77 milliwatts which yielded a 10.59 percent reduction of power. Using the optimized cells also resulted in a size reduction of the micro-controller (5.44 percent area reduction). Furthermore, there was no affect in circuit speed of the microprocessor.

By now it should be obvious that a method for generating an optimized cell library has been provided. The cell library is optimized for specific operating characteristics such as low power or increased speed. The method includes simulating a cell in parallel with more than one computer work station to reduce the time period for optimization of the cell library. A cost function is provided to generate a cost from the simulation results of a cell. The cost corresponds to the quality of the cell relative to the specific operating characteristics. Simulated annealing is used to generate new parameter values from the cost. The cell is resimulated multiple times with new parameter values to improve the specific operating characteristics. Each cell in the library is optimized.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method for generating an integrated circuit cell library optimized for specific operating characteristics, the method comprising the steps of:

(a) providing a cost fiction;

(b) using simulated annealing to generate parameter values for simulation of a cell of the integrated circuit cell library;

(c) simulating said cell in parallel with more than one computer work station wherein said more than one computer work station simultaneously runs a transistor level simulation of said cell; wherein said simulating step comprises the steps of:

generating a parameterized netlist of said cell; and
reading said parameterized netlist to said more than one computer work station;

(d) providing simulation results from said more than one computer work station to said cost function;

(e) calculating a cost which corresponds to a quality of said cell relative to the specific operating characteristics;

(f) providing said cost for a simulated annealing process to generate new parameter values for simulation;

(g) resimulating said cell with said new parameter values;

(h) providing simulation results from simulations with said new parameter values to said cost function; and (i) calculating a cost from said simulation results with said new parameter values.

2. The method as recited in claim 1 further including a step of generating a stimulus file for said cell of the integrated circuit cell library.

3. The method as recited in claim 2 further including the steps of:

dividing said stimulus file into a plurality of simulation run files; and distributing said plurality of simulation run files to said more than one work station.

4. The method as recited in claim 1 further including the steps of:

(j) repeating step (f); and
(k) repeating steps (g), (h), and (i).

5. The method as recited in claim 4 further including the steps of:

(l) selecting a new library cell having parameter values best optimized for the specific operating characteristics; and (m) incorporating said new library cell in a new integrated circuit cell library.

6. The method as recited in claim 5 further including the steps of:

(n) repeating steps (a), (b), (c), (d), and (e);
(o) repeating step (f);
(p) repeating steps (g), (h), and (i);
(q) repeating steps (j) and (k); and
(r) repeating steps (l) and (m)

for each cell of the integrated circuit cell library.

7. A method of generating an integrated circuit cell library optimized for specific operating characteristics comprising the steps of:

(a) generating a stimulus file for a cell of the integrated circuit cell library;

(b) generating a parameterized netlist of said cell for a transistor level simulation of said cell;

(c) having more than one computer work station read said parameterized netlist of said cell;

(d) dividing said stimulus file into a plurality of simulation run files;

(e) distributing said plurality of simulation run files to said more than one computer work station;

(f) simulating said cell simultaneously at each of said more than one computer work station;

(g) evaluating simulation results from said more than one computer work station;

(h) generating new parameter values for said parameterized netlist based on previous simulation results; and (i) providing a cost function;

wherein said step of evaluating simulation results from said more than one computer work station includes a step of:

(j) providing said simulation results to said cost function to generate a cost, said cost corresponds to a quality of said cell relative to the specific operating characteristics; and wherein said step of generating new parameters for said parameterized netlist includes a step of:

(k) applying simulated annealing to said cost to generate new parameter values.

8. The method as recited in claim 7 further including the steps of:

(l) repeating simulation of said cell for each new set of parameter values;

(m) stopping simulation of said cell after a predetermined number of simulations;

(n) selecting parameter values of said cell producing a best cost; and (o) generating a new library optimized for the specific operating characteristics wherein a new library cell having parameter values corresponding to said best cost is included in said new library.

9. The method as recited in claim 8 further including the steps of;

(p) repeating steps (a), (b), (c), (d), (e), (f), (g), and (h);
(q) repeating step (i); and
(r) repeating steps (l), (m), (n), and (o)

for each cell of the integrated circuit cell library.

10. A method of automating the process of generating a cell library for specific operating characteristics, the method comprising the steps of:

(a) generating a stimulus file for a cell of the cell library;

(b) generating a parameterized netlist of said cell;

(c) reading said parameterized netlist to more than one computer work station;

(d) dividing said stimulus file into a plurality of simulation run files wherein each simulation run file is a simulatable portion of said stimulus file;

(e) distributing a simulation run file to each of said more than one computer work station;

(f) providing a cost unction for evaluating simulation results for the specific operating characteristics of said cell;

(g) simulating said cell with said more than one computer work station;

(h) generating a cost which corresponds to a quality of said cell meeting the specific operating characteristics by providing simulation results to said cost function;

(i) Applying simulated annealing to said cost to generate new parameter values to optimize said cell for the specific operating characteristics;

(j) repeating steps f, g, and h with said new parameters;

(k) stopping simulation of said cell after a predetermined number of simulations; and (l) repeating steps a, b, c, d, e, f, g, h, i, j, and k for each cell of the integrated circuit cell library.

* * * * *

UNITED STATES PATENT AND TRADEMARK OFFICE
CERTIFICATE OF CORRECTION

PATENT NO. : 5,802,349
DATED : September 1, 1998
INVENTOR(S) : Dana M. Rigg et al.

It is certified that error appears in the above-identified patent and that said Letters Patent is hereby corrected as shown below:

In claim 1, column 6, line 60, replace "fiction" with --function--.

In claim 10, column 8, line 44, replace "unction" with --function--.

Signed and Sealed this

Eleventh Day of May, 1999

*Attest:*

Q. TODD DICKINSON

*Attesting Officer*   Acting Commissioner of Patents and Trademarks